(12) United States Patent
De Santis et al.

(10) Patent No.: US 9,436,402 B1
(45) Date of Patent: Sep. 6, 2016

(54) METHODS AND APPARATUS FOR PATTERN MATCHING

(75) Inventors: Luca De Santis, Avezzano (IT); Giulio G. Marotta, Rieti (IT); Marco-Domenico Tiburzi, Avezzano (IT); Tommaso Vali, Latina (IT); Frankie F. Roohparvar, Monte Sereno, CA (US); Agostino Macerola, San Benedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 680 days.

(21) Appl. No.: 13/449,082

(22) Filed: Apr. 17, 2012

Related U.S. Application Data

(60) Provisional application No. 61/476,574, filed on Apr. 18, 2011.

(51) Int. Cl.
  *G06F 11/263* (2006.01)
  *G06F 3/06* (2006.01)
  *G11C 16/06* (2006.01)

(52) U.S. Cl.
  CPC .............. *G06F 3/0628* (2013.01); *G11C 16/06* (2013.01)

(58) Field of Classification Search
  CPC ............... G06F 17/3087; G06F 2207/025; G06F 17/30985; G06F 17/30988; G06F 12/0246; G06F 11/1016; G06F 11/1666; G06F 7/02; G06F 7/607; G06F 11/1048; G06F 11/1068; G06F 3/0689; G06F 11/10; G06F 11/1044; G06F 11/1076; G06F 9/44; G06F 17/30982; G06F 11/3072; G06F 13/4077; G06F 3/0628; G11C 16/06
  See application file for complete search history.

(56) References Cited

U.S. PATENT DOCUMENTS

| | | | |
|---|---|---|---|
| 6,065,055 A * | 5/2000 | Hughes et al. | 709/229 |
| 6,147,890 A | 11/2000 | Kawana et al. | |
| 6,324,087 B1 | 11/2001 | Pereira | |
| 6,625,746 B1 * | 9/2003 | Moore | 714/6.1 |
| 6,693,815 B2 | 2/2004 | Mattausch et al. | |
| 7,016,243 B1 | 3/2006 | Srinivasan et al. | |
| 7,296,113 B2 | 11/2007 | Somasundaram | |
| 7,414,873 B2 | 8/2008 | Winograd et al. | |
| 7,552,275 B1 | 6/2009 | Krishnan | |
| 2003/0033557 A1 * | 2/2003 | Okazaki | 714/27 |
| 2005/0289295 A1 * | 12/2005 | Shoham et al. | G11C 15/00 711/108 |
| 2007/0088910 A1 * | 4/2007 | Parthasarathy et al. | 711/108 |
| 2007/0277065 A1 * | 11/2007 | Sato | 714/703 |

(Continued)

OTHER PUBLICATIONS

Noda et al., "A Cost-Efficient High-Performance Dynamic TCAM with Pipelined Hierarchical Searching and Shift Redundancy Architecture," *IEEE Journal of Solid-State Circuits*, vol. 40, No. 1, pp. 245-253, Jan. 2005.

(Continued)

*Primary Examiner* — David X Yi
*Assistant Examiner* — Candice Rankin
(74) *Attorney, Agent, or Firm* — Dicke, Billig & Czaja, PLLC

(57) ABSTRACT

Methods and apparatus for pattern matching are disclosed. In at least one embodiment, pattern checking is accomplished by reading a page of memory, and comparing the read page with the pattern to be searched in a logic operation. In at least one other embodiment, a pattern to be searched is stored in registers where each bit of the pattern is stored using two register entries and each bit of the array data is stored using two cells of the array.

30 Claims, 11 Drawing Sheets

(56) References Cited

U.S. PATENT DOCUMENTS

2009/0172345 A1* 7/2009 Allen et al. .................. 711/208
2009/0190404 A1 7/2009 Roohparvar
2009/0307542 A1* 12/2009 Roohparvar ................. 714/704
2011/0202709 A1* 8/2011 Rychlik ....................... 711/103
2011/0208904 A1* 8/2011 Fujito et al. ................. 711/103

OTHER PUBLICATIONS

Miwa et al., "A 1-Mb 2-Tr/b Nonvolatile CAM Based on Flash Memory Technologies," *IEEE Journal of Solid-State Circuits*, vol. 31, No. 11, pp. 1601-1609, Nov. 1996.

* cited by examiner

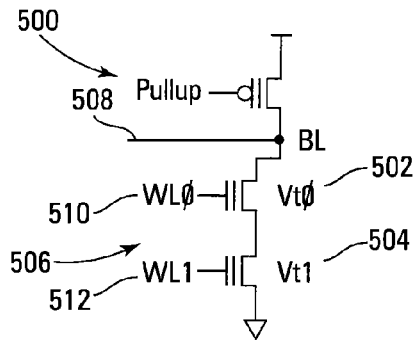
FIG. 5
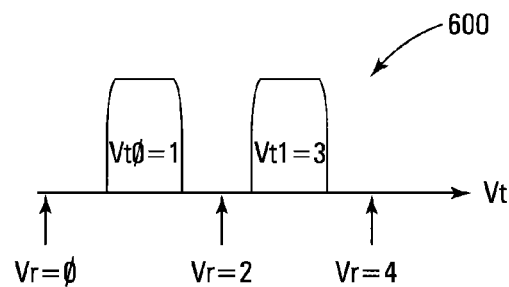
FIG. 6
| Stored Data | Search Data (WL0,WL1) (volts) | | | | | | |
|---|---|---|---|---|---|---|---|
| Vt0(v) Vt1(v) | 0 | 0 | 2 | 4 | 4 | 2 | 4 |
| 1    3 | x | x | O | O | O | X | O |
| 3    1 | x | x | X | O | O | O | O |
| 1    1 | x | x | O | O | O | O | O |
| 3    3 | x | x | X | O | O | X | O |
X=OFF  BL=VCC
O=ON   BL=GND
FIG. 7

METHODS AND APPARATUS FOR PATTERN MATCHING

RELATED APPLICATION

This application claims priority to U.S. Provisional Application Ser. No. 61/476,574, filed Apr. 18, 2011, and entitled "METHODS AND APPARATUS FOR PATTERN MATCHING."

FIELD

The present disclosure relates generally to memory and in particular, in one or more embodiments, the present disclosure relates to methods and apparatus for pattern matching.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

Content addressable memories (CAM) are memories that implement a lookup table function in a single clock cycle. They use dedicated comparison circuitry to perform the lookups. CAM application are often used in network routers for packet forwarding and the like. Each individual memory bit in a CAM requires its own comparison circuit in order to allow the CAM to detect a match between a bit of the key word with a bit stored in the CAM. Typical CAM cells, then, use approximately nine to ten transistors for a static random access memory (SRAM)-based CAM, or four to five transistors for a dynamic random access memory (DRAM)-based CAM.

Current CAM technology allows for a density of approximately four to eight megabytes, with clock cycle times of approximately 10 nanoseconds. A key word is typically input to the CAM for matching. Key words range in size up to about 144 bits. While current CAM technology allows for fast searching, it is limited in total stored content size, as well as key word size.

For the reasons stated above, and for other reasons stated below which will become apparent to those skilled in the art upon reading and understanding the present specification, there is a need in the art for increased CAM density and functionality.

BRIEF DESCRIPTION OF DRAWINGS

FIG. 5 is a circuit diagram of a portion of a memory;

FIG. 6 is a diagram of representative read and threshold voltages according to an embodiment of the disclosure;

FIG. 7 is a table showing outcomes of searches of search data versus stored data according to an embodiment of the disclosure;

DETAILED DESCRIPTION

Figure 1:
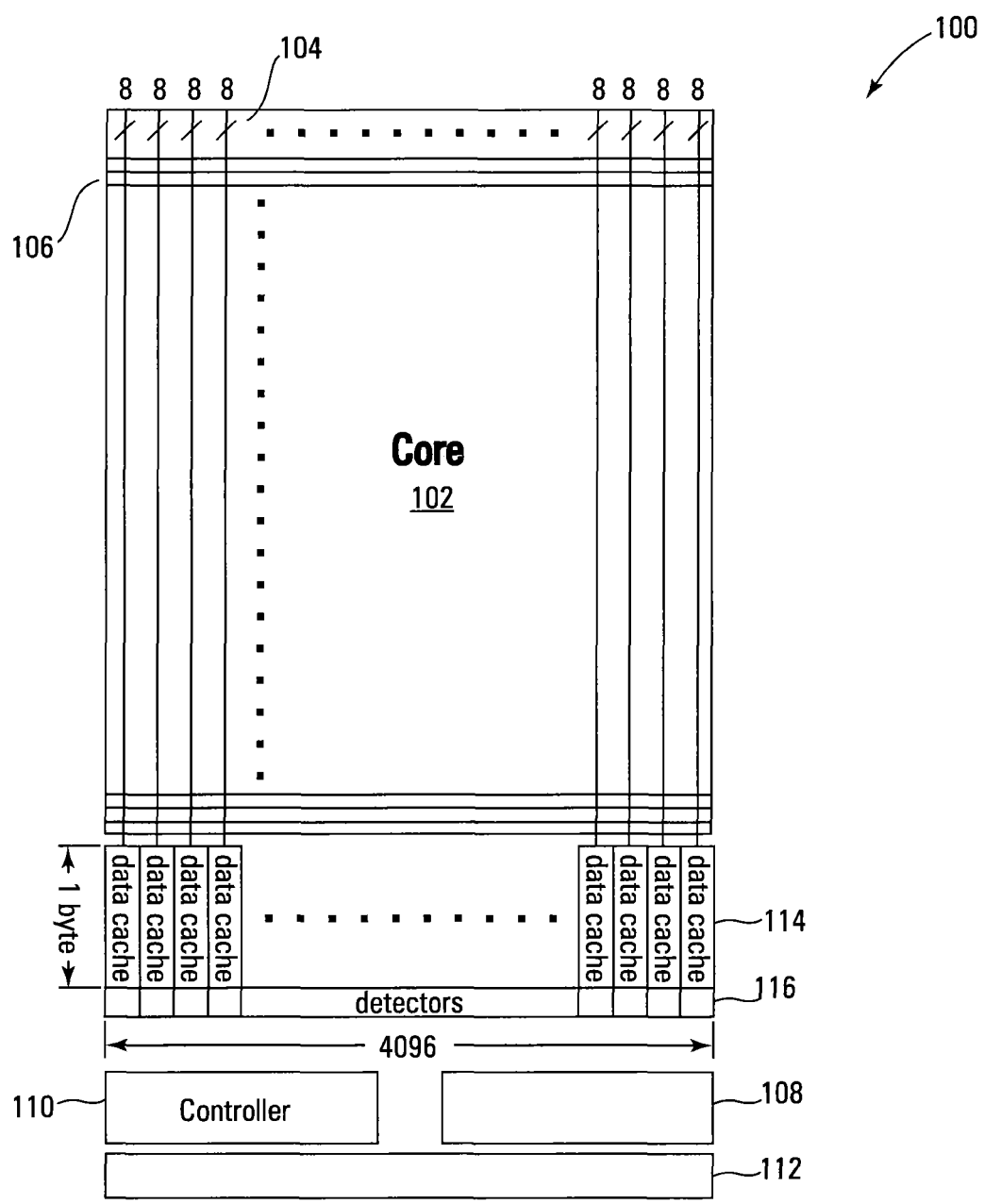
FIG. 1 is a block diagram of a memory on which embodiments of the disclosure may be practiced.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Referring generally to FIG. 1, a NAND flash memory device 100 typically comprises a memory array 102 divided into columns (accessed by data lines 104, such as those commonly referred to as bit lines) and rows (accessed by access lines 106, such as those commonly referred to as word lines), a voltage generation system 108, a controller 110, input/output circuitry 112 for command and data transfers, and a plurality of page buffers 114, each page buffer coupled to a bit line and which are used to latch data sensed from the array during a read operation, and to store data to be programmed into the array, and to a bank 116 of data detectors.

Figure 2:
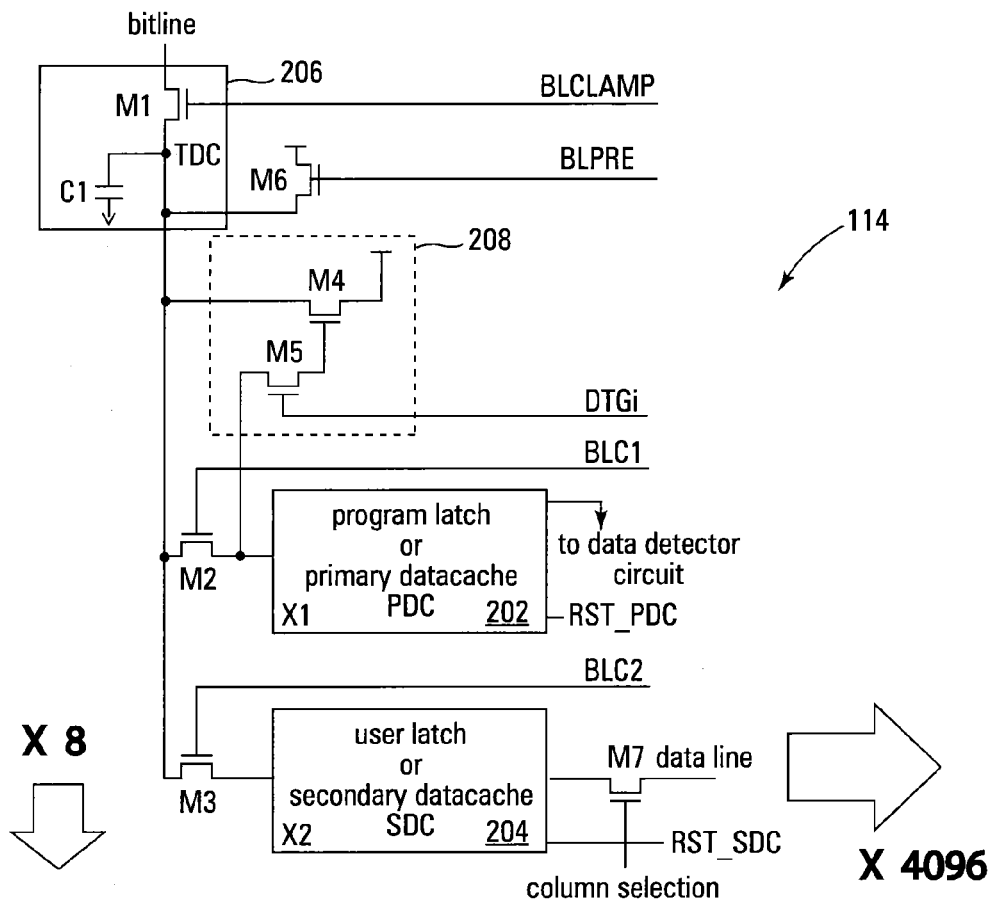
FIG. 2 is a block diagram of more detail of a page buffer.

One example of a page buffer 114 is shown in greater detail in FIG. 2. Page buffer 114 is a circuit block comprising a number of memory elements and additional circuitry. The page buffer 114 stores data read from the array, or user data to be written to the array. Page buffer 114 also can perform basic logic functions, such as AND, OR, and NOT operations, on the data. Page buffer 114 comprises in one embodiment a pair of static memory elements, a first data cache 202 (sometimes referred to as a primary data cache or PDC), and a second data cache 204 (sometimes referred to as a secondary data cache or SDC). PDC 202 holds data that are used to keep the bit line at a voltage level sufficient to shift a threshold voltage of a memory cell during programming, or to sense the data from a bit line during a read operation. SDC 204 is a memory element accessible to a user, and is used as a data read/write buffer. The PDC and SDC are independent from one another. Page buffer 114 further comprises a sense amplifier 206 to read data from memory cells, and a number of dynamic memory elements 208. The controller 110 can move data in the PDC 202 to the SDC 204 to allow it to be read by a user, or to any of the dynamic memory elements 208 for use in logical operations.

For example, an XNOR operation may be used during programming to verify whether all cells have been programmed to the value input by the user. In a verify operation, data are read from the array after each programming pulse, and loaded into the PDC. Then a logic operation PDC=PDC XNOR SDC is performed. After one or more programming pulses, the data read into the PDC from the array should eventually be equal to the user data that is to be programmed to the array, and the PDC will, after the PDC XNOR SDC operation, contain all logical 1 values. The controller detects the all logical 1 values in the PDC and identifies programming as complete.

Figure 3:
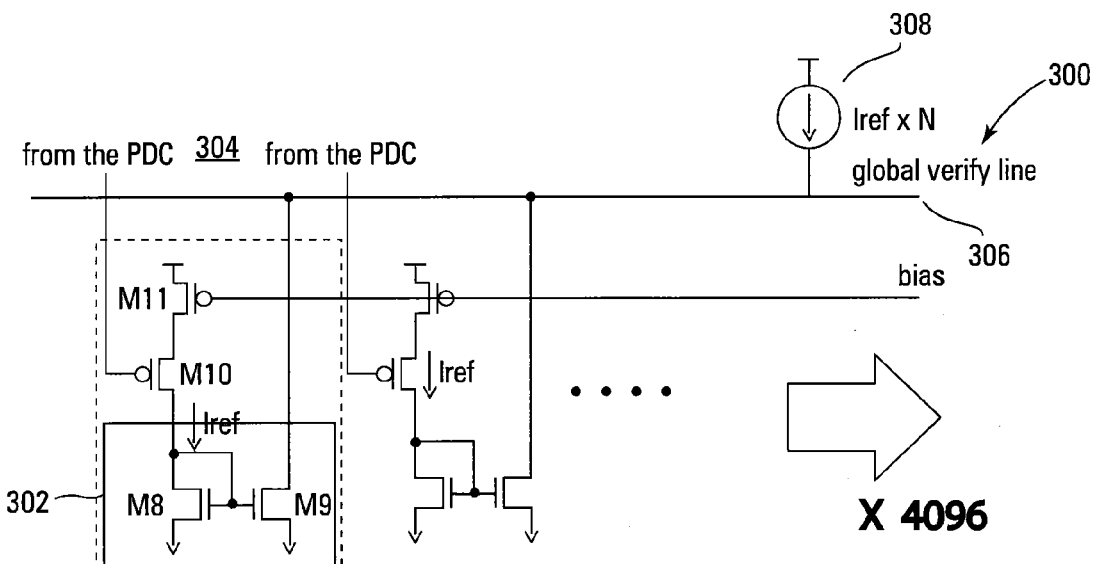
FIG. 3 is a block diagram of more detail of a detector.

Each page buffer 114 is coupled to one data detector circuit 116 of the bank plurality of data detector circuits as shown in greater detail in FIG. 3. Each data detector 300 comprises a current mirror 302 gated by the output 304 from the PDC 202 of its data cache. For each bit of the PDC, if the bit value is a logical 0, a current equal to reference current Iref is mirrored on the global verify line 306. The plurality of data detectors are all coupled with an OR circuit to the global verify line 306. For detecting, the global verify line 306 is initially pre-charged to a logic high value. The global verify line 306 is driven to logical 0 unless all data in the PDC are logic 1 value.

The detector bank 116 can also detect when all the PDC data are logic 1 values except a for a determined number N of them. To accomplish this, if the global verify line 306 is discharged, then it can be pre-charged again, and a reference current Iref 308 injected onto the global verify line 306. The current Iref may be set at various levels. For example, Iref1 is a current sufficient to overcome the discharge of the global verify line 306 due to one bit value of logic 0 in the PDC data. A reference current Iref1, in one embodiment twice the current of Iref1, is sufficient to overcome the discharge of the global verify line 306 for up to two bit values of logic 0 in the PDC data. Increasing Iref currents (Iref*N) may be applied (e.g., injected) to determine a number of non-logic 1 values in the PDC data. The number N will depend upon available current, and may, in one embodiment, be set by a user.

Since the ability to determine whether a number of PDC bit values, up to N, are logic 0 values, this arrangement is used in one embodiment for pattern matching, such as in a CAM embodiment of the NAND array. If a user desires to know whether a certain pattern, for example, a page-wide pattern, is stored in a memory array, and also desires to know the address of the pattern, the arrangement of FIGS. 1-3 may be used to determine that.

Figure 4A:
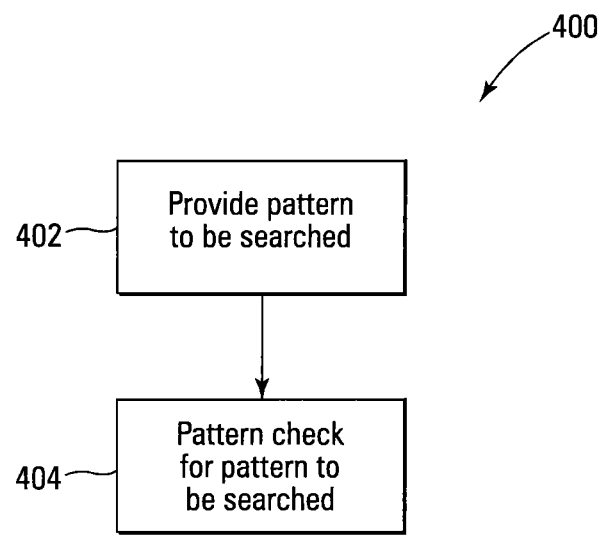
FIGS. 4A, 4B, 4C, and 4D are flow chart diagrams of methods according to various embodiments of the disclosure.
Figure 4B:
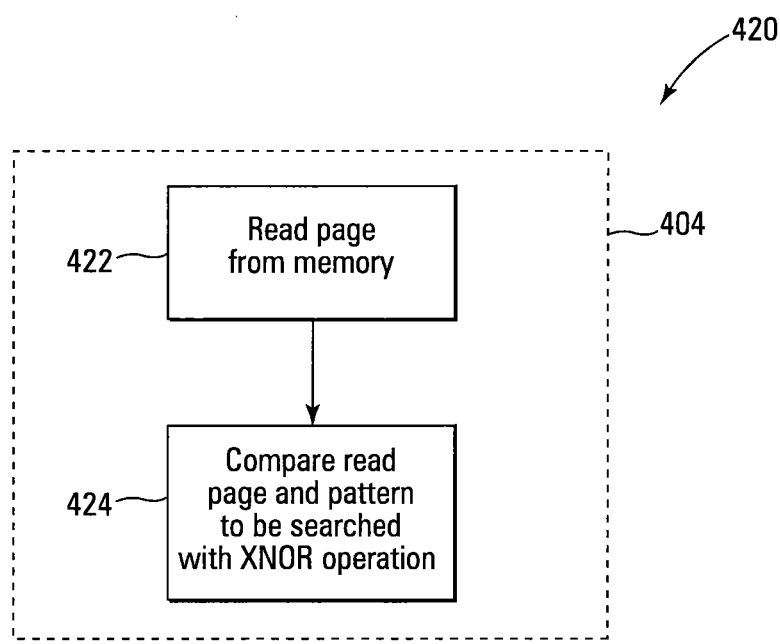

In one embodiment, shown in flow chart form in FIG. 4A, a method 400 for pattern matching comprises providing a pattern to be searched in the memory in block 402, and pattern checking for the pattern to be searched in the memory in block 404. In one embodiment 420 shown in FIG. 4B, pattern checking further comprises reading a page from the memory in block 422, and comparing with an XNOR operation the read page and the pattern to be searched in block 424.

The page is read from the memory in one embodiment into a first cache, such as PDC 202 of FIG. 2, and the pattern to be searched is loaded into a second cache, such as SDC 204 of FIG. 2, before the XNOR operation. Once the XNOR operation is complete, the result of the XNOR operation is applied to a bank of detectors such as detectors 116, and a global verify line such as global verify line 306 is checked as in a verify operation. If the global verify line is still charged, that is it has a logic 1 value, then the data in the first and cache and the data in the second cache match. This result is obtained when the XNOR operation combining the first and second data caches results in all logic 1 values. In one embodiment, the result of the XNOR operation is written to the first data cache before applying it to the detectors.

If a match of the pattern to be searched (loaded into the second cache) and page data written to the first cache is found, the location of the start of the match may be stored. If no match of the pattern to be searched and page data is found, the page address is incremented, and the page corresponding to the incremented page address is read, the first cache and the second cache are combined in an XNOR operation, and another determination is made if a match has occurred. This method may be repeated until an end page address is reached or a match is found.

While a full page pattern is described for searching herein, it should also be understood that less than a full page pattern may also be searched without departing from the scope of the disclosure.

Reading a page in one embodiment comprises setting a starting page address and an ending page address and reading the page at the starting page address into the first data cache.

In another embodiment, a reference current such as that described above is injected onto the global verify line at a value of Iref*N, where N is an integer representing a number of bits less than the total number of bit errors in the pattern matching. In this embodiment, if the global verify line remains charged at a logic 1 value, then more than all the bits minus N are matched between the data read into the first cache and the pattern to be searched that is in the second cache. In one embodiment, the first cache is a PDC of the memory, and the second cache is a SDC of the memory. When the pattern to be searched is found, that is, when the XNOR operation results in a logical 1 value for all bits and therefore does not discharge the global verify line, or up to N bits are incorrect but the appropriate reference current is injected to the global verify line, one embodiment sets a status bit to indicate the pattern to be searched has been found.

Additionally, an address of the start of the pattern to be searched may also be stored. If additional reference current is injected onto the global verify line, for example Iref*3, before the global verify line remains charged to a logical 1 value, the number N (in this example 3) can also be stored to indicate how many bits between the pattern to be searched and the pattern in the memory do not match. This can be done in one embodiment on a page by page basis, or in another embodiment by whatever pattern is to be searched. Further, a number of failing bits can be stored for each page of the memory.

Figure 4C:
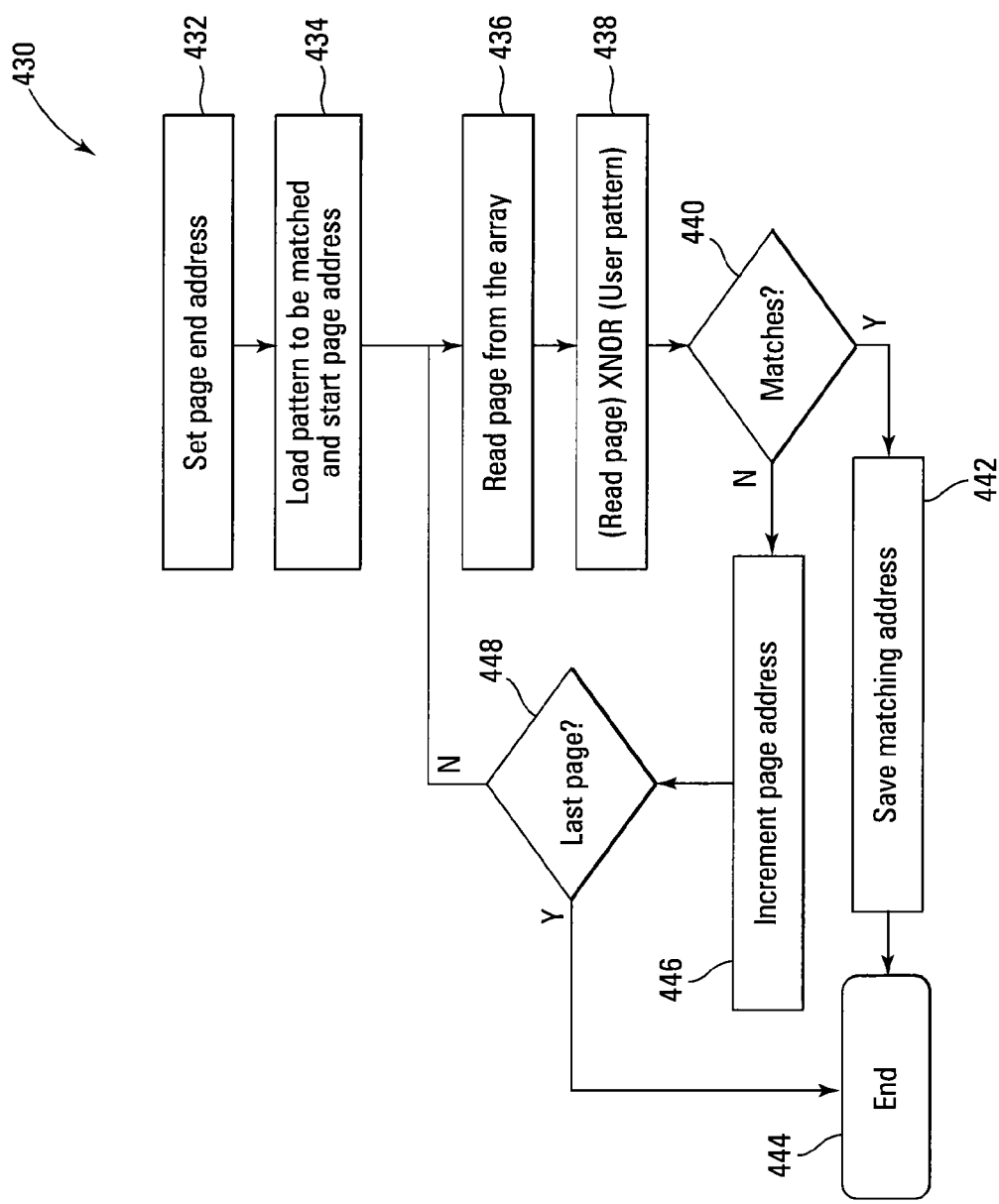

A flow chart for a more detailed method 430 for pattern matching is shown in greater detail in FIG. 4C. Method 430 comprises setting a page end address in block 432, loading a pattern to be searched and a starting page address in block 434, reading a page from the memory array in block 436, and combining the read page and the pattern to be searched with an XNOR operation in block 438. If the read page and the pattern to be searched match, as determined in decision block 440, the matching address is saved in block 442, and the process is complete at block 444. If the read page and the pattern to be searched to not match, the page address is incremented at block 446, and process flow continues at block 436, until the last page, as determined in decision block 448 by the previously set end page address, is reached. This may be checked after incrementing the page address, as shown in block 446.

Figure 4D:
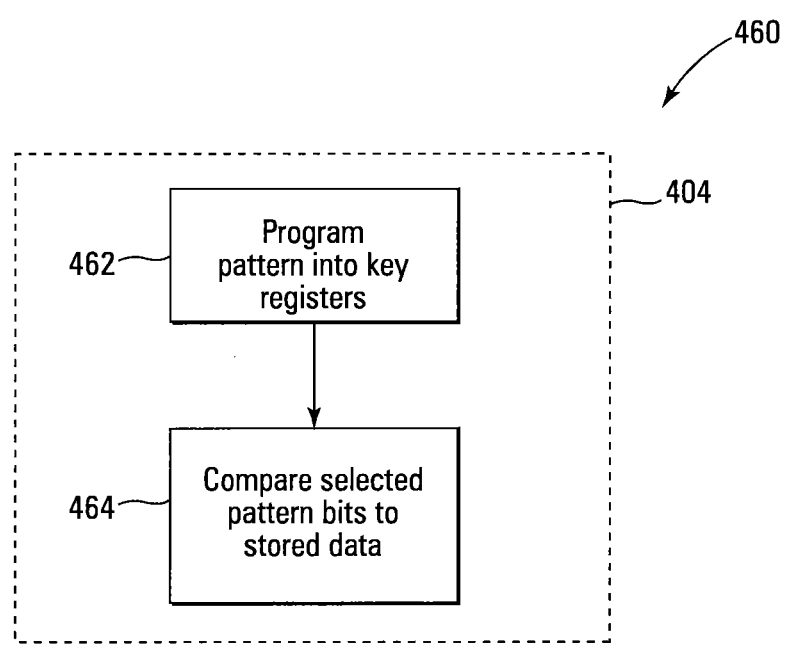

In another embodiment 460, shown in greater detail in FIG. 4D, pattern matching (block 404 of FIG. 4A) comprises programming the pattern to be searched into a plurality of registers in block 462, and comparing selected programmed bits of the pattern to data stored in the array in block 464. An error count for the comparison may also be determined. Comparing is performed in one embodiment by activating bit lines for specific word lines in the array.

Referring now also to FIGS. 5, 6, 7, and 8, in one embodiment 800, a key word 802 is identified as the basis for the pattern that is to be searched. The key word 802 comprises a number of bits, each bit being a logical 1 or logical 0 in one embodiment. The key word is in one embodiment programmed into key registers, with each bit of the key word using two register entries, wherein a specific pattern of voltages is applied to the gates of particular memory cells of the array for each bit of the key word. In one embodiment, register bit 0 causes a voltage of 2 volts to be applied to the gate of the first cell of the two cells, and register bit 1 causes a voltage of 4 volts to be applied to the gate of the second cell of the two cells. This combination of voltages at the gates of the cells corresponds to a bit having a value of 0. A bit having a value of 1 is stored in the key register as a register bit 0 causing a voltage of 4 volts to be applied to the gate of the first cell of the two cells, and register bit 1 causing a voltage of 2 volts to be applied to the gate of the second cell of the two cells. Therefore, programming a pattern programs each bit of the pattern into two register entries that identify the single key word bit. Then, comparison is made to a representation of data stored in the array, where each bit of stored data is also represented by two cells, each having its own programmed threshold voltage.

In the case of data stored in the array, a logical 0 is programmed into two cells and is represented by a first threshold voltage of 3 volts on the first cell and a second threshold voltage of 1 volt on the second cell, and a logical 1 is programmed into two cells and is represented by a first threshold voltage of 1 volt on the first cell and a second threshold voltage of 3 volts on the second cell. The cell gate voltages and threshold voltage values are used in a sensing operation, with the word line voltages applied through a multiplexer to blocks having the coded stored data, also coded to have threshold voltages of 1 or 3 volts, with a logical 0 represented by Vt0=3 volts and Vt1=1 volt and a logical 1 represented by Vt0=1 volt and Vt1=3 volts.

The basic string structure, threshold voltages and read voltages, and a table of stored data versus search data and resultant match or no-match outcomes are shown in FIGS. 5, 6, and 7. FIG. 5 shows a portion 500 of a memory array, having a representative set of two memory cells 502 and 504 which are part of a string 506 of memory cells. A data line 508 is coupled to the string 506. In FIG. 5, the gates of the cells 502 and 504 are coupled to access lines 510 and 512. It is these access lines that have applied to them the voltages that are programmed into the key registers described herein. Representative threshold voltages programmed onto the memory cells are shown in FIG. 6. Threshold diagram 600 shows that cell 502 has a threshold voltage Vt0 of 1 volt, and cell 504 has a threshold voltage Vt1 of 3 volts. The two threshold voltages of Vt0=1 and Vt1=3 correspond to a stored value of 1. FIG. 7 shows a table 700 having stored data values compared with search data values, in which X values indicate that the cell is off, and O values indicate that the cell is on. If a cell is on, a sensing operation results in a discharge of the bit line, indicating that no match is present between the voltages applied to the access lines 510 and 512 (from the key register) to the cells 502 and 504. Each cell pair and each register bit pair of values allow for a matching or a non-matching determination for a bit of the key word.

While one set of threshold voltages and gate voltages are described herein, it should be understood that as cell structures vary, or array and threshold voltages change, different sets of voltages may be used without departing from the scope of the disclosure.

Figure 8A:
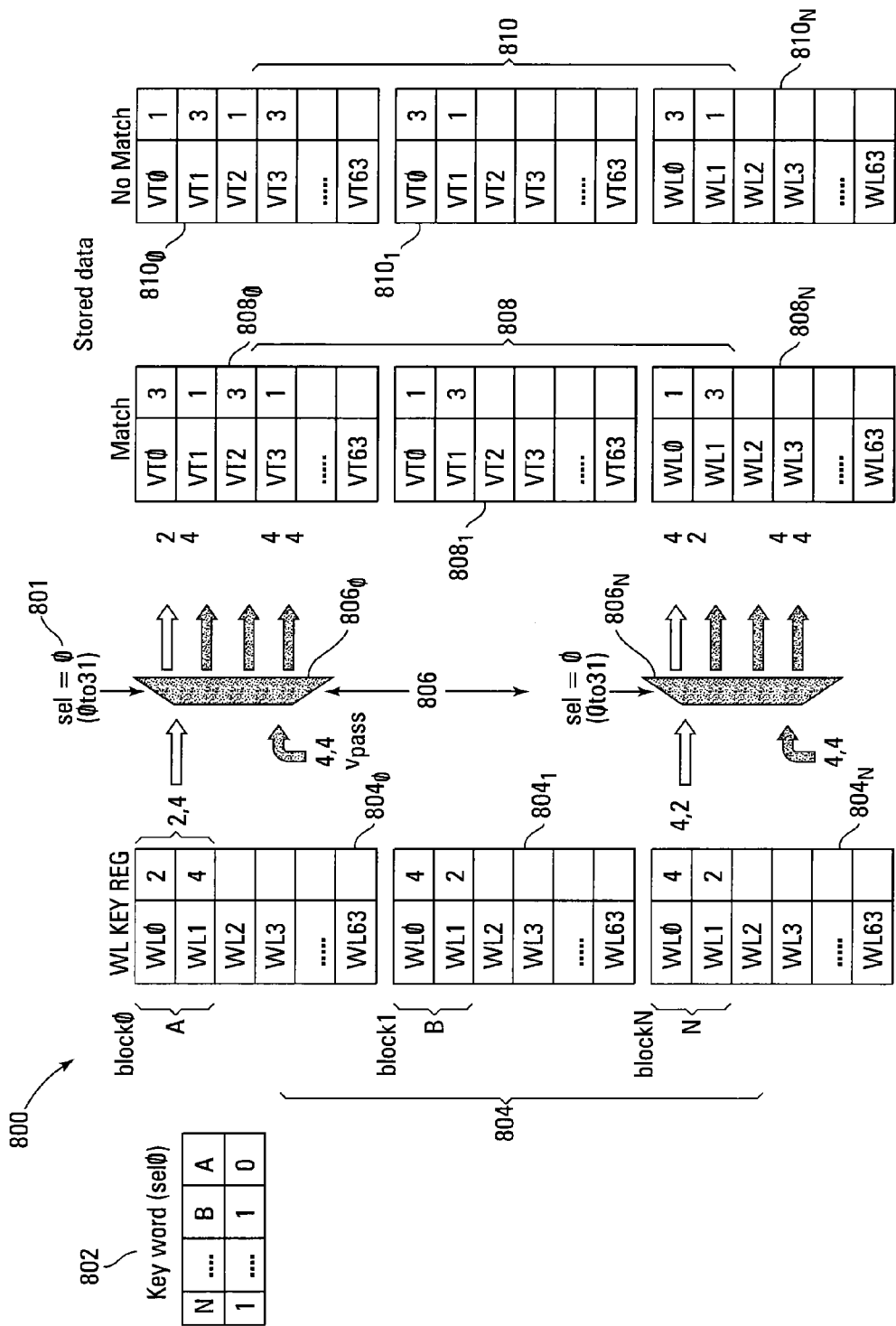
FIG. 8A is a diagram showing a partial view of a search function according to an embodiment of the disclosure.

FIG. 8A shows a key word having N bits, and selected with select signal 0, indicated at 801. Each bit of the key word is programmed into two bits of a key register 804. There are N key registers $804_0$, $804_1$, . . . $804_N$ in one embodiment, each key register representing a block of entries, corresponding therefore to 32 bits of the key word. Each key register $804_0$, $804_1$, . . . $804_N$ has a multiplexer $806_0$, $806_1$, . . . $806_N$ to select a key register pair to compare with a data cell pair. The multiplexer 806 for each key register 804 selects the two values of the respective bit in each block (bit0 and bit1 of key register 0 for first bit of the key word, bit0 and bit1 of key register 1 for the second bit of the key word, . . . bit0 and bit1 of key register N for the Nth bit of the key word, etc. . . . ) The select signal for the multiplexer determines which pair of key register entries are used for applying to the current key word, in this case programming the key word into the key register in the first two entries of each key register. The stored coded voltages for the key register bits are applied to the selected cells that are at the position on the page which is being pattern matched. That is, bit0 and bit1 voltages of key register 0 are selected through multiplexer 806 and are applied as the gate voltages for the cells 0 and 1 in the string of the page being searched for a match. A pass voltage is applied to the gates of all remaining cells of the string. Match and non-match data are shown at the right side of FIG. 8 as strings $808_0$, $808_1$, . . . $808_N$ and $810_0$, $810_1$, . . . $810_N$, respectively.

If the key word data is a logical 0 (shown as bit A of the key word 802), and the stored data is a logical 0 (shown as Vt0 and Vt1 of string $808_0$, the gate of cell 0 of block $808_0$ will have 2 volts applied thereto, the gate of cell 1 of block $808_0$ will have 4 volts applied thereto, Vt0 will be 3 volts, and Vt1 will be 1 volt. In that circumstance, the gate voltage of 2 volts does not turn on the cell with a Vt0 of 3 volts, the gate voltage of 4 volts does turn on the cell with Vt1 of 1 volt, but the one cell that remains off prevents the bit line from discharging, and indicates a data match to that bit of stored data. If the key word data is a logical 0 (shown as bit A of the key word 802), and the stored data is a logical 1 (shown as Vt0 and Vt1 of string $810_0$, the gate of cell 0 of block $810_0$ will have 2 volts applied thereto, the gate of cell 1 of block $810_0$ will have 4 volts applied thereto, Vt0 will be 1 volt, and Vt1 will be 3 volts. In that circumstance, the gate voltage of 2 volts turns on the cell with a Vt0 of 1 volt, the gate voltage of 4 volts turns on the cell with Vt1 of 1 volt, and the bit line is discharged, indicating a data non-match to that bit of stored data.

Figure 8B:
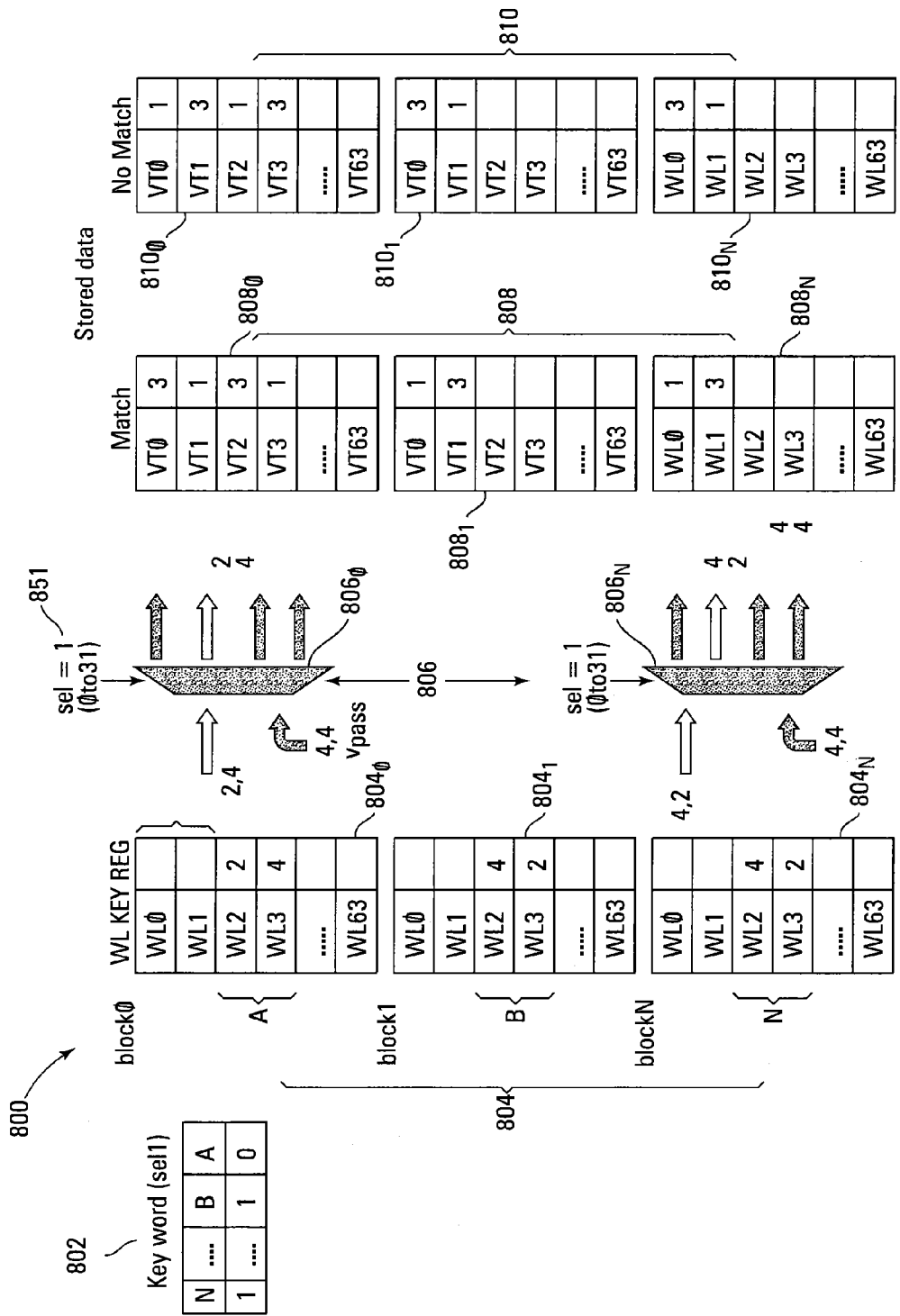
FIG. 8B is a diagram showing a partial view of another search function according to an embodiment of the disclosure.

FIG. 8B shows operation for a select 1 signal to the multiplexers 806, indicated at 851. In this case, the key word is programmed into the key register in the third and fourth entries of each key register. If the key word data is a logical 0 (shown as bit A of the key word 802), and the stored data is a logical 0 (shown as Vt2 and Vt3 of string $808_0$, the gate of cell 2 of block $808_0$ will have 2 volts applied thereto, the gate of cell 3 of block $808_0$ will have 4 volts applied thereto, Vt2 will be 3 volts, and Vt3 will be 1 volt. In that circumstance, the gate voltage of 2 volts does not turn on the cell with a Vt2 of 3 volts, the gate voltage of 4 volts does turn on the cell with Vt3 of 1 volt, but the one cell that remains off prevents the bit line from discharging, and indicates a data match to that bit of stored data. If the key word data is a logical 0 (shown as bit A of the key word 802), and the stored data is a logical 1 (shown as Vt2 and Vt3 of string $810_0$, the gate of cell 2 of block $810_0$ will have 2 volts applied thereto, the gate of cell 3 of block $810_0$ will have 4 volts applied thereto, Vt2 will be 1 volt, and Vt3 will be 3 volts. In that circumstance, the gate voltage of 2 volts turns on the cell with a Vt2 of 1 volt, the gate voltage of 4 volts turns on the cell with Vt3 of 1 volt, and the bit line is discharged, indicating a data non-match to that bit of stored data.

All other cells have pass voltages applied to their gates, so that only the cells of the selected bit of the key word in each block are used in the match/no match decision. Similarly, each combination of search data versus stored data has a match or a non-match situation, with a match keeping the associated bit line charged, and a non-match discharging the associated bit line.

With a key word having a number of bits equal to or smaller than the number of blocks N, an entire key word can be checked in parallel at one time. With a key word having a number of bits greater than the number of blocks N, N bits of the key word can be checked in parallel at one time, and a new select signal can be issued for additional bits of the key word above the number of blocks N. For example, for bits of the key word from bit N+1 to bit 2N, the select signal (such as signals 801 and 851) is set to 1, and the multiplexers 806 select the key word register third and fourth entries, and so on.

Figure 9:
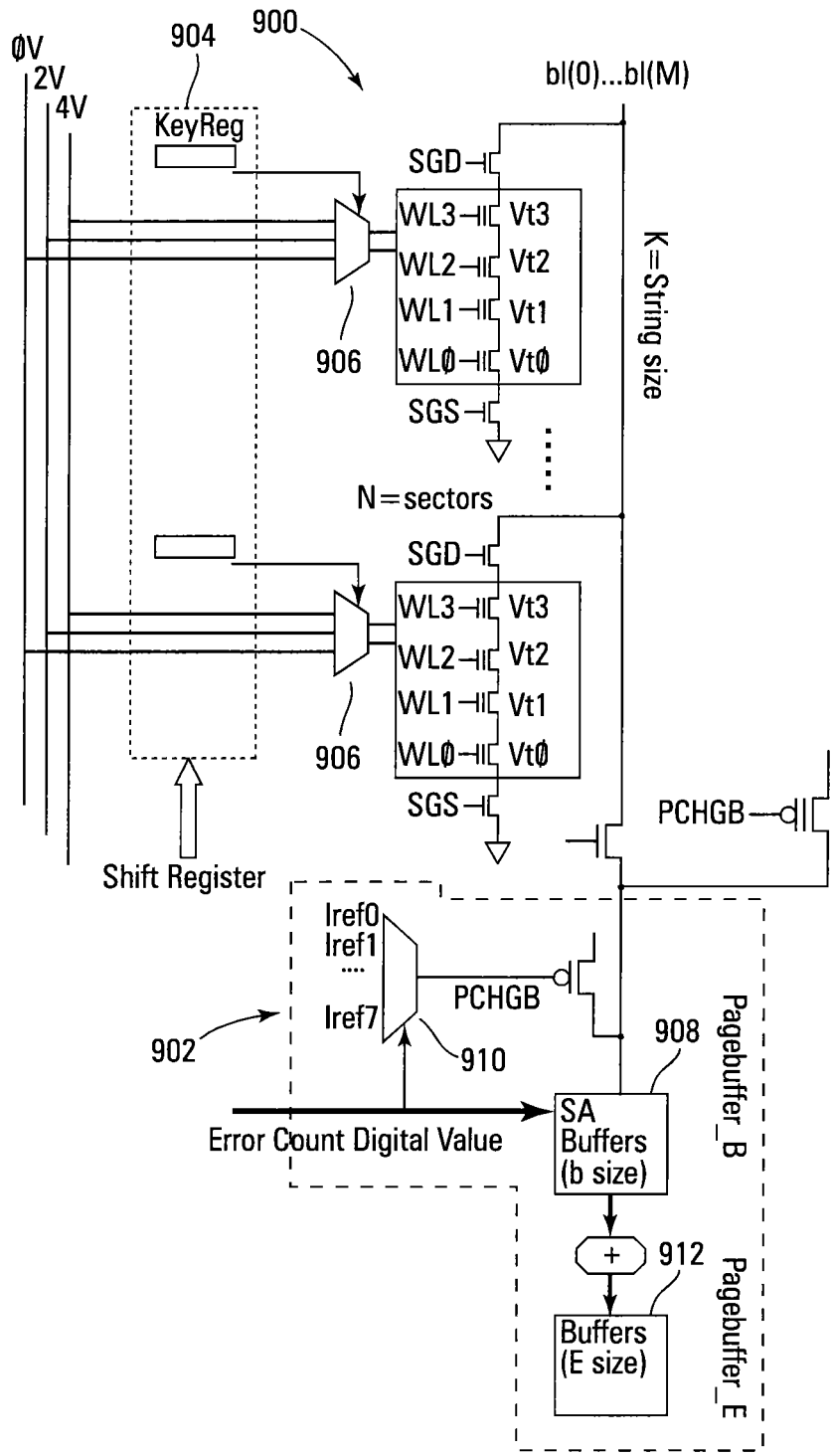
FIG. 9 is a block diagram of a portion of a memory according to another embodiment of the disclosure.

If a near-match is to be searched for, such as for example, a pattern stored in the array that matches the pattern to be searched but for a determined number of bits, for example, E, a counter for the number of errors is used in another embodiment. FIG. 9 is a block diagram of a system 900 with a counter 902 for determining a number of non-match bits in a string or series of strings. The system 900 uses key registers 904 as in the systems described above. In the example, suppose K is the string size, N is a number of blocks, and M is a number of bit lines in the system. The key word to be searched, i.e., matched, in the array can have K/2*N bits. Stored data comprise M key words stored in an array of M*K*N cells in the array. A set of multiplexers 906, a multiplexer for each block, selects a pair of voltages from its respective key register 904 to apply to the gates of the selected memory cells that are to be checked for a match. All other cell gates of the block are provided with an appropriate pass voltage.

For sensing to determine whether a match has been found, the bit lines are precharged, an error counter 902 value is set to zero, and a sense operation on the bit lines is performed. If a bit line does not discharge, there is a match of all selected bits on that string, and the counter 902 stores an error count of zero, in one embodiment into page buffer 908. If the bit line does discharge, that indicates at least one bit that does not match. The error count value is incremented up one, the bit lines are again precharged, an increased reference current selected by multiplexer 910 is injected onto the bit lines, and the sense operation is again performed. This is repeated, summing the total number of errors, up to a maximum number of errors set by the number of available increased reference currents. When the number of errors in the selected cells is determined, that number is summed into a total error buffer 912, the array address is incremented, and the next set of cell pairs in the array are selected for passing values from the key registers 904 to be searched as is described above. This is performed until the end of the key register data is reached or the end of the string is reached. A total number of errors for the entire keyword is stored in error buffer 912. If the total number of errors is zero for the key word, the key word is matched. If the total number of errors is greater than zero, then that total is indicative of a number of detected errors, subject to a maximum number of counted errors per string, determined as described elsewhere herein.

The methods described above are, in one embodiment, performed in a smaller amount of time than a typical CAM memory operation, and are capable of using far larger key words and searching far larger arrays. For example, a typical load time for current key word registers is approximately 20 nanoseconds, which is performed K/2*N times. For 64 cell strings and 1024 blocks, a key word will load in about 650 microseconds. Sensing takes approximately 10 microseconds, and will be performed K/2 times (32 for 64 cell string) with 20 nanoseconds per bit line (typically 64000). So, for searching a 32000 bit pattern in a database of 64000 patterns, an expected time is about 2.3 milliseconds. As read, write and sense times change, that is only an example, and different read, write and/or sense times will affect the overall time for completion of the matching operation, as will different sized patterns (e.g., key words) to be searched, and such changes are within the scope of the disclosure.

Figure 10:
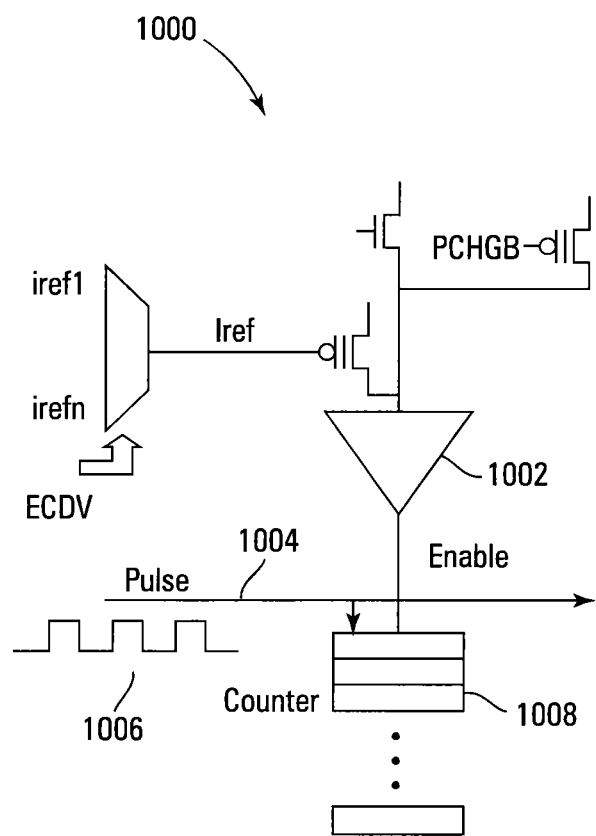
FIG. 10 is a circuit diagram of a portion of a memory according to another embodiment of the disclosure.

In another embodiment 1000, shown in greater detail in FIG. 10, error counting is performed in a different way. The counter circuit 1008 counts errors between stored data and data to be searched. An error count value is determined and stored as follows. The key word to be searched is stored in the key registers as before, and data in the array is stored as before. A sense operation is performed. If the bit line stays charged, then there are no errors, and the enable signal, from sense amplifier block 1002, is a logical 0. No error count of any type is passed to the counter 1008, as there are no errors. If the bit line discharges, an increasing series of reference currents are injected onto the bit line as described above. Once a number of errors for the string is determined, or a maximum error value has been reached, the enable signal from sense amplifier block 1002 is set to logical 1, and pulse line 1004 applies a number of pulses 1006 to the counter 1008. The number of pulses on the pulse line 1004 is equal to the error count value. The counter accumulates the number of non-match bits between the key word and the data to be searched, subject to the maximum errors countable per string.

It should be understood that while the embodiments disclosed herein are shown as implemented in a NAND memory, other memories, such as NOR and the like may be employed without departing from the scope of the disclosure.

Figure 11:
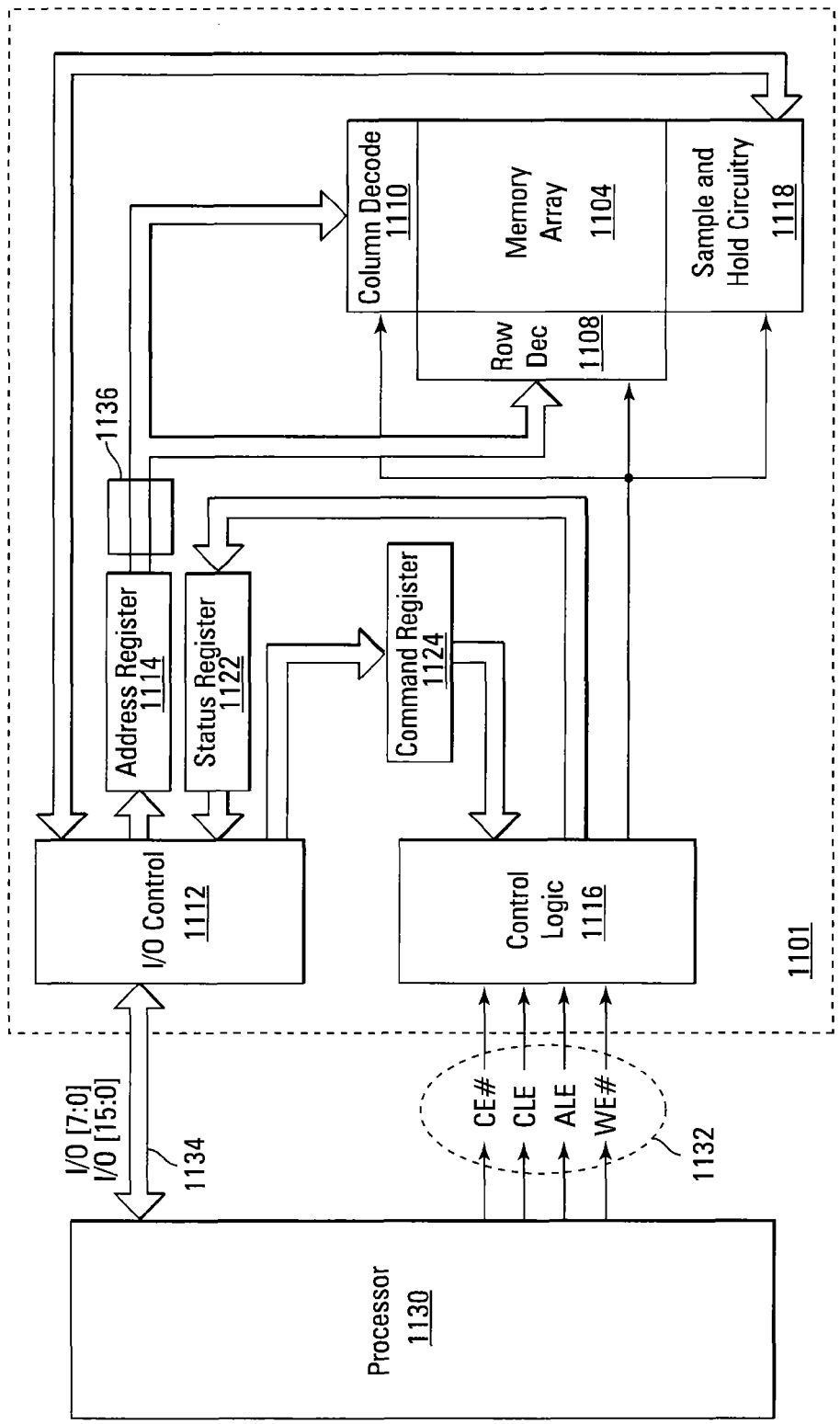
FIG. 11 is a functional block diagram of an electrical system having at least one memory device with a memory array configuration according to one embodiment of the present invention.

FIG. 11 is a simplified block diagram of a memory device 1101 according to an embodiment of the disclosure, and on which various embodiments of the disclosure can be practiced. Memory device 1101 includes an array of memory cells 1104 arranged in rows and columns. Although the various embodiments will be described primarily with reference to NAND memory arrays, the various embodiments are not limited to a specific architecture of the memory array 1104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell. Control logic 1116 is one example of a controller, such as controller 110.

A row decode circuitry 1108 and a column decode circuitry 1110 are provided to decode address signals provided to the memory device 1101. Address signals are received and decoded to access memory array 1104. Memory device 1101 also includes input/output (I/O) control circuitry 1112 to manage input of commands, addresses and data to the memory device 1101 as well as output of data and status information from the memory device 1101. An address register 1114 is coupled between I/O control circuitry 1112 and row decode circuitry 1108 and column decode circuitry 1110 to latch the address signals prior to decoding. A command register 1124 is coupled between I/O control circuitry 1112 and control logic 1116 to latch incoming commands. Control logic 1116 controls access to the memory array 1104 in response to the commands and generates status information for the external processor 1130. The control logic 1116 is coupled to row decode circuitry 1108 and column decode circuitry 1110 to control the row decode circuitry 1108 and column decode circuitry 1110 in response to the addresses.

Control logic 1116 can be coupled to a sample and hold circuitry 1118. The sample and hold circuitry 1118 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 1118 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 1112 for output from the memory device, in the case of a read operation, or used for comparison during one or more verify operations in programming the memory device. It is noted that the I/O control circuitry 1112 could optionally include analog-to-digital conversion functionality and digital-to-analog conversion (DAC) functionality to convert read data from an analog data signal to a digital bit pattern and to convert write data from a digital bit pattern to an analog signal such that the memory device 1101 could be adapted for communication with either an analog or digital data interface.

During a write operation, target memory cells of the memory array 1104 are programmed until voltages indicative of their Vt levels match the levels held in the sample and hold circuitry 1118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a sense operation, the Vt levels of the target memory cells are passed to the sample and hold circuitry 1118 for transfer to an external processor (not shown in FIG. 11) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 1118 may include caching, i.e., multiple storage locations for each data value, such that the memory device 1101 may be reading a next data value while passing a first data value to the external processor, or receiving a next data value while writing a first data value to the memory array 1104. A status register 1122 is coupled between I/O control circuitry 1112 and control logic 1116 to latch the status information for output to the external processor.

Memory device 1101 receives control signals at control logic 1116 over a control link 1132. The control signals may include a chip enable CE#, a command latch enable CLE, an address latch enable ALE, and a write enable WE#. Memory device 1101 may receive commands (in the form of command signals), addresses (in the form of address signals), and data (in the form of data signals) from an external processor over a multiplexed input/output (I/O) bus 1134 and output data to the external processor over I/O bus 1134.

In a specific example, commands are received over input/output (I/O) pins [7:0] of I/O bus 1134 at I/O control circuitry 1112 and are written into command register 1124. The addresses are received over input/output (I/O) pins [7:0]

of bus 1134 at I/O control circuitry 1112 and are written into address register 1114. The data may be received over input/output (I/O) pins [7:0] for a device capable of receiving eight parallel signals, or input/output (I/O) pins [15:0] for a device capable of receiving sixteen parallel signals, at I/O control circuitry 1112 and are transferred to sample and hold circuitry 1118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 11 has been simplified to help focus on the embodiments of the disclosure.

Methods for pattern matching of a key word to data stored in the array 1104 may be performed in various embodiments on a memory such as memory 1100. In some embodiments, CAM circuitry 1136, which in various embodiments includes key registers, multiplexers, and/or counters, is coupled between the address register 1114 and the array 1104 for implementing methods such as those described above. Such methods are shown and described herein with reference to FIGS. 1-10.

While the memory device of FIG. 11 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1134. Because the data signals represent bit patterns instead of individual bits, serial communication of an 8-bit data signal could be as efficient as parallel communication of eight signals representing individual bits.

CONCLUSION

Methods of matching a pattern to be searched with data in memories, and memories using the methods have been described. In particular, some embodiments store key words and array data so that two bits of a key register and two cells are used for matching, with a bit of a key word identified by two key word register entries and a bit of stored data identified with the two cells. Patterns are matched by comparing the representations of key word data and stored array data, and a number of errors can be counted.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is intended that this disclosure be limited only by the claims and the equivalents thereof.

What is claimed is:

1. A method of pattern matching in a memory, comprising:
   providing a pattern to be searched in the memory; and
   pattern checking for the pattern to be searched in the memory, wherein pattern checking further comprises:
      reading at least a portion of a page from the memory;
      comparing the at least a portion of the read page and the pattern to be searched;
      determining whether a number of bit errors between the at least a portion of the read page and the pattern to be searched is less than or equal to a particular number of bit errors, wherein the particular number of bit errors is greater than or equal to one; and
      deeming the comparison a match when the number of bit errors is less than or equal to the particular number of bit errors;
   wherein comparing the at least a portion of the read page and the pattern to be searched comprises combining the at least a portion of the read page and the pattern to be searched with an XNOR operation.

2. The method of claim 1, wherein reading at least a portion of a page from the memory comprises reading the at least a portion of the page into a first cache of a page buffer of the memory, and wherein the pattern to be searched is loaded into a second cache of the page buffer of the memory.

3. The method of claim 2, and further comprising detecting when all the data in the first data cache are is except for a determined number N of them.

4. The method of claim 1, and further comprising:
   setting a status bit to indicate whether the pattern to be searched has been found.

5. The method of claim 1, and further comprising:
   storing an address of a location within the memory where a match of the pattern to be searched begins.

6. The method of claim 1, and further comprising:
   storing the number of bit errors.

7. The method of claim 1, wherein reading at least a portion of a page comprises:
   setting a starting page address and ending page address; and
   reading the page at the starting page address into a first cache.

8. The method of claim 7, wherein pattern checking further comprises:
   combining the first cache and a second cache having the pattern to be searched with an XNOR operation; and
   determining if a match between the first cache and the second cache has occurred.

9. The method of claim 8, wherein determining if a match between the first cache and the second cache has occurred comprises determining whether at least a particular number of logical 1 values are in the XNOR result.

10. The method of claim 8, wherein the results of the XNOR operation are written to the first cache.

11. The method of claim 8, and further comprising:
    if a match of the pattern to be searched and data read into the first cache is found, identifying a location of the start of the match; and
    if no match of the pattern to be searched and data read into the first cache is found, incrementing the page address; and
    repeating reading a page, combining the first cache and the second cache, and determining if a match has occurred until a match is found or an ending page address is reached.

12. The method of claim 1, wherein the pattern to be searched is a full page pattern.

13. The method of claim 1, wherein the pattern to be searched is less than a full page in size.

14. A method of pattern matching in a memory, comprising:
    providing a pattern to be searched in the memory; and
    pattern checking for the pattern to be searched in the memory, wherein pattern checking further comprises:
       reading at least a portion of a page from the memory, wherein reading at least a portion of a page from the memory comprises reading the at least a portion of the page into a first cache of a page buffer of the memory;

comparing the at least a portion of the read page and the pattern to be searched, wherein the pattern to be searched is loaded into a second cache of the page buffer of the memory;

determining whether a number of bit errors between the at least a portion of the read page and the pattern to be searched is less than or equal to a particular number of bit errors, wherein the particular number of bit errors is greater than or equal to one; and deeming the comparison a match when the number of bit errors is less than or equal to the particular number of bit errors;

wherein determining whether a number of bit error is greater than or equal to the particular number of bit errors comprises:

programming the first data cache to values resulting from an XNOR combination of the first cache with the second cache; and determining whether the first data cache contains at least a number of logical 1 values equal to the particular number.

15. A method of pattern matching in a memory, comprising:

programming a pattern to be searched into a plurality of registers of the memory, each bit of the pattern associated with two separate register entries;

pattern checking for the pattern to be searched in the memory, wherein each bit of data stored in the memory is stored in two cells of the memory; and determining an error count for the pattern checking;

wherein determining an error count comprises:

precharging a selected data line of a string of memory cells of the memory array;

sensing on the data line;

if the data line does not discharge, storing an error count value of zero;

if the data line discharges, precharging the data line, applying a reference current to the data line at a first level sufficient to overcome a single bit non-match in the string, and sensing to determine if the data line discharges;

if the data line does not discharge, storing an error count value equal to one; and if the data line discharges, incrementing the reference current to a next level sufficient to overcome an additional bit non-match in the string, precharging the data line, sensing, and if the data line discharges, repeating until a maximum reference current is reached or the data line stays charged; and storing an error count based on the reference current at which the data line remains charged.

16. The method of claim 15, wherein determining an error count further comprises:

determining an error count between the pattern to be searched and a portion of data read from the memory.

17. The method of claim 16, wherein pattern checking comprises comparing selected programmed bits of the pattern to data stored in the memory array.

18. The method of claim 17, wherein comparing results in a match when the cells are coupled to a precharged data line which does not discharge.

19. The method of claim 17, wherein comparing results in a non-match when the cells are coupled to a precharged data line which does discharge.

20. The method of claim 16, wherein comparing is performed using data line activation for specific access lines of the memory array.

21. The method of claim 16, wherein each bit of the pattern is programmed into two bits of the register, wherein gate voltages are applied to gates of two respective cells of the memory responsive to the two programmed bits.

22. The method of claim 21, wherein the two cells are adjacent cells in a same string of the memory.

23. The method of claim 21, wherein pattern checking comprises applying the programmed gate voltages of a selected bit of the pattern to be searched to the two respective cells of the stored data.

24. The method of claim 21, wherein a 0 value in the pattern to be searched is coded as a first voltage in the first bit of the register and a second voltage in the second bit of the register; and wherein a 1 value in the pattern to be searched is coded as the second voltage in the first bit of the register and the first voltage in the second bit of the register.

25. The method of claim 24, wherein a 0 value is coded in stored data as a first threshold voltage on a first cell and a second threshold voltage on a second cell, and a 1 value is coded in stored data as the second threshold voltage on the first cell and the first threshold voltage on the second cell.

26. The method of claim 16, wherein programming the pattern comprises programming a key word.

27. The method of claim 16, wherein determining an error count further comprises, when at least one non-match error between the pattern to be searched and the data stored in a string of the memory is detected, providing a plurality of pulses to a counter, the number of pulses corresponding to the number of errors in the string.

28. The method of claim 27, wherein determining an error count further comprises:

setting an enable signal when at least one non-match error is found in the string, and incrementing the counter by a number indicated by a number of pulses applied to the counter equal to the count of non-match errors on the string when the enable signal is set.

29. A memory device, comprising:

an array of memory cells;

circuitry configured to perform a method comprising:

loading, into the memory device, a pattern to be searched within data stored in the array of memory cells; and pattern checking for the pattern to be searched within data stored in the array of memory cells, wherein pattern checking comprises:

reading at least a portion of a page from the array of memory cells;

comparing the at least a portion of the read page and the pattern to be searched;

determining whether a number of bit errors between the at least a portion of the read page and the pattern to be searched is less than or equal to a particular number of bit errors, wherein the particular number of bit errors is greater than or equal to one; and deeming the comparison a match when the number of bit errors is less than or equal to the particular number of bit errors; and deeming the comparison a match when the number of bit errors is less than or equal to the particular number of bit errors;

wherein comparing the at least a portion of the read page and the pattern to be searched comprises combining the at least a portion of the read page and the pattern to be searched with an XNOR operation.

30. A memory device, comprising:

an array of memory cells;

circuitry configured to perform a method comprising:

programming a pattern to be searched into a plurality of registers of the memory, such that each bit of the pattern to be searched is stored as two separate register entries;

pattern checking for the pattern to be searched within data stored in the array of memory cells, wherein each bit of data to be searched in the array of memory cells is stored in a respective two memory cells of the array of memory cells; and determining an error count for the pattern checking;

wherein determining an error count comprises:

precharging a selected data line of a string of memory cells of the memory array;

sensing on the data line;

if the data line does not discharge, storing an error count value of zero;

if the data line discharges, precharging the data line, applying a reference current to the data line at a first level sufficient to overcome a single bit non-match in the string, and sensing to determine if the data line discharges;

if the data line does not discharge, storing an error count value equal to one;

if the data line discharges, incrementing the reference current to a next level sufficient to overcome an additional bit non-match in the string, precharging the data line, sensing, and if the data line discharges, repeating until a maximum reference current is reached or the data line stays charged; and storing an error count based on the reference current at which the data line remains charged.

* * * * *